United States Patent
Kwak

(10) Patent No.: US 10,461,711 B2
(45) Date of Patent: Oct. 29, 2019

(54) METHOD AND APPARATUS FOR OUTPUTTING AUDIO SIGNAL, METHOD FOR CONTROLLING VOLUME

(71) Applicant: Gaonda Corporation, Goyang, Gyeonggi-Do (KR)

(72) Inventor: Sang-Yeop Kwak, Seoul (KR)

(73) Assignee: Gaonda Corporation, Goyang, Gyeonggi-do (KR)

( * ) Notice: Subject to any disclaimer, the term of this patent is extended or adjusted under 35 U.S.C. 154(b) by 537 days.

(21) Appl. No.: 14/323,326

(22) Filed: Jul. 3, 2014

(65) Prior Publication Data
US 2014/0334642 A1 Nov. 13, 2014

Related U.S. Application Data

(63) Continuation of application No. PCT/KR2013/000032, filed on Jan. 3, 2013.

(30) Foreign Application Priority Data

Jan. 3, 2012 (KR) .................. 10-2012-0000732

(51) Int. Cl.
*H03G 3/20* (2006.01)
*H04R 29/00* (2006.01)
(Continued)

(52) U.S. Cl.
CPC .............. *H03G 3/20* (2013.01); *H03G 5/165* (2013.01); *H03G 9/005* (2013.01); *H03G 9/025* (2013.01);
(Continued)

(58) Field of Classification Search
CPC .......... H03G 3/20; H03G 5/165; H03G 9/005; H03G 9/025; H04S 7/00; H04R 25/30; H04R 25/305; H04R 25/70; H04R 29/008
(Continued)

(56) References Cited

U.S. PATENT DOCUMENTS 6,198,061 B1 * 3/2001 Amari .................... H01H 9/181
                                                          200/310
6,350,243 B1 * 2/2002 Johnson ............... A61B 5/0051
                                                          600/559
(Continued)

FOREIGN PATENT DOCUMENTS

JP    2011-515182 A    5/2011
KR    10-0671360 B1    6/2002
(Continued)

OTHER PUBLICATIONS

International Search Report issued from PCT International Application No. PCT/KR2013/000032 dated Apr. 22, 2013.
(Continued)

*Primary Examiner* — Davetta W Goins
*Assistant Examiner* — Daniel R Sellers
(74) *Attorney, Agent, or Firm* — Mintz Levin Cohn Ferris Glovsky and Popeo, P.C.; Kongsik Kim

(57) ABSTRACT

A method and apparatus for outputting an audio signal and a method of adjusting the volume of an audio signal are provided. An embodiment of the present invention provides a method for outputting an audio signal that includes: (a) determining an output level of a modulated signal to be outputted for each respective frequency band by using a hearing threshold measured for the respective frequency band; and (b) outputting the modulated signal and an audio signal simultaneously. An embodiment of the present invention can improve hearing ability by outputting an audio signal and a modulated signal together. Also, according to an embodiment of the present invention, a user can use visual signals to personally set the output level of audio signals that is optimal for each frequency band in accordance with changes in the user's dynamic hearing threshold for each respective frequency band, even while listening to audio signals of which the output level for each frequency band was determined previously.

7 Claims, 8 Drawing Sheets

(51) Int. Cl.
 H03G 5/16 (2006.01)
 H03G 9/00 (2006.01)
 H03G 9/02 (2006.01)
 H04S 7/00 (2006.01)
 H04R 25/00 (2006.01)
(52) U.S. Cl.
 CPC ............ *H04R 29/008* (2013.01); *H04S 7/00* (2013.01); *H04R 25/30* (2013.01); *H04R 25/305* (2013.01)
(58) Field of Classification Search
 USPC ........................................ 381/102, 312, 314
 See application file for complete search history.

(56) References Cited

U.S. PATENT DOCUMENTS

| | | | | |
|---|---|---|---|---|
| 6,428,485 | B1* | 8/2002 | Rho | A61B 5/12 |
| | | | | 600/559 |
| 8,583,247 | B1* | 11/2013 | Hood | A61N 1/37247 |
| | | | | 607/137 |
| 2002/0068986 | A1* | 6/2002 | Mouline | A61B 5/121 |
| | | | | 700/94 |
| 2003/0083591 | A1* | 5/2003 | Edwards | A61B 5/121 |
| | | | | 600/559 |
| 2007/0189545 | A1* | 8/2007 | Geiger | A61B 5/121 |
| | | | | 381/60 |
| 2009/0268919 | A1* | 10/2009 | Arora | H04R 25/70 |
| | | | | 381/56 |

FOREIGN PATENT DOCUMENTS

| | | |
|---|---|---|
| KR | 10-0963888 B1 | 6/2009 |
| KR | 10-009-0082776 A | 7/2009 |

OTHER PUBLICATIONS

1st Office Action issued from Korean Patent Application No. 10-2012-0000732 dated Nov. 12, 2012.

Notice of Allowance issued from Korean Patent Application No. 10-2012-0000732 dated Nov. 21, 2013.

* cited by examiner

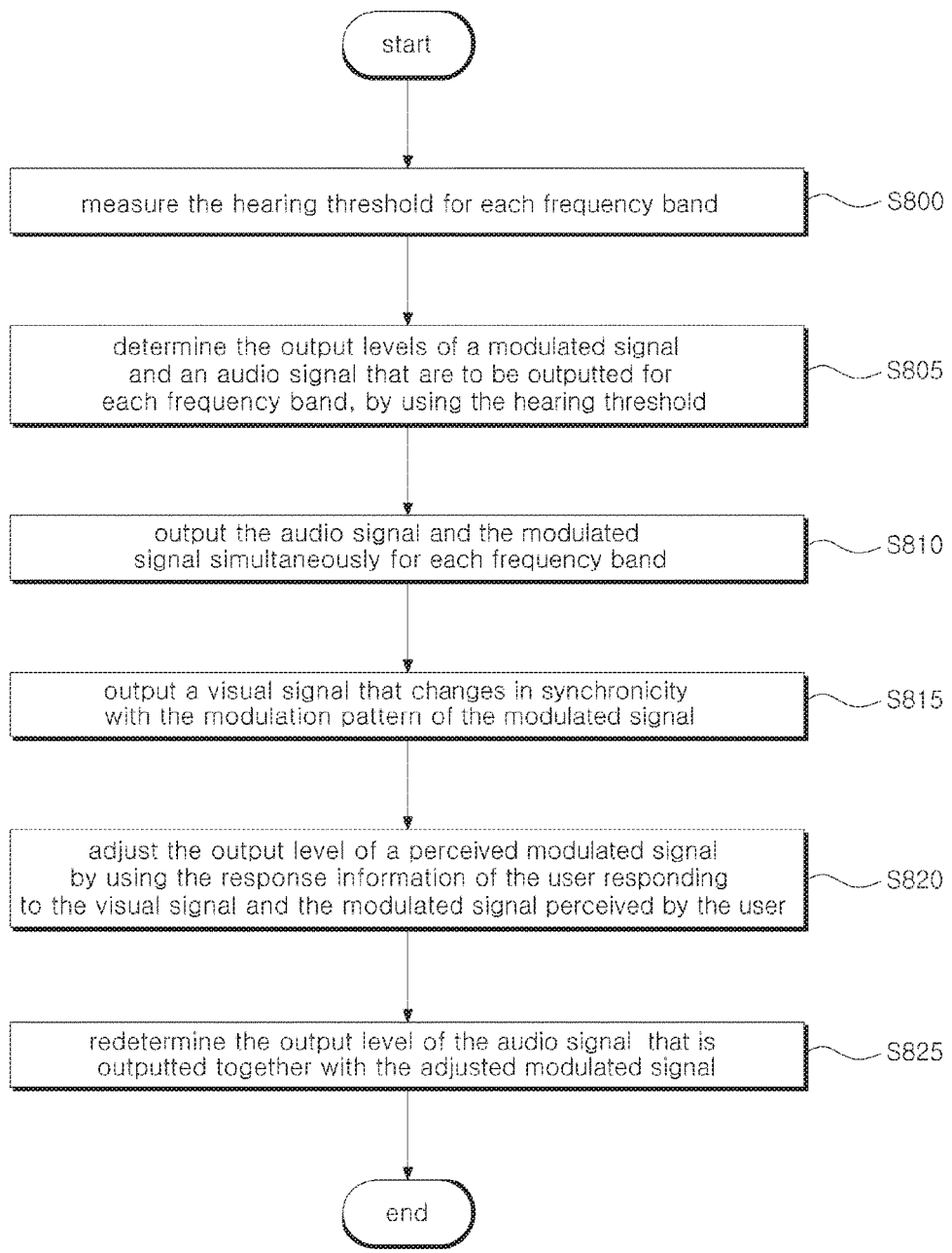

METHOD AND APPARATUS FOR OUTPUTTING AUDIO SIGNAL, METHOD FOR CONTROLLING VOLUME

CROSS-REFERENCE TO RELATED APPLICATIONS

This application is a continuation of International Application No. PCT/KR2013/000032 filed on Jan. 3, 2013, which claims priority to Korean Application No. 10-2012-0000732 filed on Jan. 3, 2012, which applications are incorporated herein by reference.

TECHNICAL FILED

The present invention relates to a method and apparatus for outputting an audio signal and a method of adjusting the volume of an audio signal, more particularly to a method and apparatus that can improve the user's hearing by outputting an audio signal and a modulated signal together and can adjust the volume in accordance with the improved hearing.

BACKGROUND ART

Static hearing refers to the hearing ability represented by a conventional 2-dimensional audiogram obtained through hearing tests performed at specific times in specific environments for various frequencies. In an audiogram-based method of outputting audio signals employed in a conventional multi-channel digital hearing aid, etc., the static hearing values obtained at specific times in specific environments are used as a basis for determining the output level for each frequency band.

The procedure for deciding the output level for each frequency band may be referred to as "fitting". In an existing static hearing-based method of outputting audio signals for each frequency band, the hearing tests and the fitting may be separated procedurally.

A conventional static hearing-based method of controlling audio output may include the steps of finding the hearing threshold for each frequency, adjusting the output of audio signals for each frequency band using the hearing thresholds thus found (i.e. fitting), and outputting the audio signals.

FIG. 1 illustrates a static hearing-based method of controlling audio output for each frequency according to the related art.

FIG. 1(a) illustrates the output levels of hearing thresholds found by the hearing test step, where the X axis represents frequency or frequency band, and the Y axis represents audio output level.

As one of the most popular methods used for a hearing test, the pure tone audiometry method, which finds the hearing thresholds by using the frequency characteristics of auditory cells, is widely being used as an internationally standardized hearing test method.

FIG. 1(b) illustrates the output levels of audio signals after adjusting the outputs for each frequency band. In FIG. 1(b), it can be seen that the audio output for each frequency band is adjusted based on static hearing by using the threshold of hearing values for the respective frequencies.

FIG. 1(c) illustrates the output levels of the audio signals as they are actually outputted.

However, considering the existing scientific fact that a person's hearing ability for each frequency can actually change when the person is exposed for a certain period of time to a sound conditioning environment for each frequency band at the hearing threshold level, it can be said that the conventional methods of controlling audio signal output based on static hearing overlook the inherently dynamic quality of a person's hearing ability.

That is, the conventional method of outputting audio signals for each frequency band based on static hearing does not consider the dynamic changes in hearing thresholds resulting from improvements in the user's hearing.

SUMMARY

To resolve the problem in the related art described above, an aspect of the present invention is to provide a method and an apparatus for outputting audio signals that can improve the user's hearing by outputting an audio signal and a modulated signal together.

Another objective of the present invention is to provide a method and an apparatus for outputting audio signals and a method of adjusting the volume of an audio signal with which to adjust the volume when the user's hearing is improved.

Other objectives of the present invention can be derived by those of ordinary skill in the art from the embodiments described below.

To achieve the objectives above, an embodiment of the present invention provides a method for outputting an audio signal that includes: (a) determining an output level of a modulated signal to be outputted for each respective frequency band by using a hearing threshold measured for the respective frequency band; and (b) outputting the modulated signal and an audio signal simultaneously.

Another aspect of the present invention provides an apparatus for outputting an audio signal that includes: an output level determining unit configured to determine an output level of a modulated signal to be outputted for each respective frequency band by using a hearing threshold measured for the respective frequency band; and an audio output unit configured to output the modulated signal and an audio signal simultaneously.

Another aspect of the present invention provides a method of diagnosing hearing ability that includes: outputting an interface which enables a user to select one or more frequency bands from among a multiple number of frequency bands; outputting a modulated signal, in the event that a user selects at least one of the plurality of frequency bands, where the modulated signal corresponds to the selected frequency band; and measuring a hearing threshold by using response information of the user responding to the modulated signal, where the modulated signal has a different modulation pattern for each of the respective frequency bands.

Yet another aspect of the present invention provides a method of adjusting volume that includes: outputting a modulated signal having an output level corresponding to a measured hearing threshold for each respective frequency band; outputting a visual signal for the respective frequency band, where the visual signal is configured to vary in synchronization with a modulation pattern of the modulated signal; receiving response information of a user responding to the visual signals and one or more of the modulated signals for the respective frequency bands, in the event that the user perceives the one or more modulated signals from among the modulated signals for the respective frequency bands as a result of improved hearing; and adjusting the output level of the one or more modulated signals by using the response information of the user, where the modulated signals have different modulation patterns for the respective frequency bands.

An embodiment of the present invention can improve hearing ability by outputting an audio signal and a modulated signal together.

Also, according to an embodiment of the present invention, a user can use visual signals to personally set the output level of audio signals that is optimal for each frequency band in accordance with changes in the user's dynamic hearing threshold for each respective frequency band, even while listening to audio signals of which the output level for each frequency band was determined previously.

BRIEF DESCRIPTION OF DRAWINGS

FIG. 8 is a flowchart illustrating the overall flow of a method of outputting audio signals according to an embodiment of the present invention.

[Description of Reference Numerals]

Figure 1:
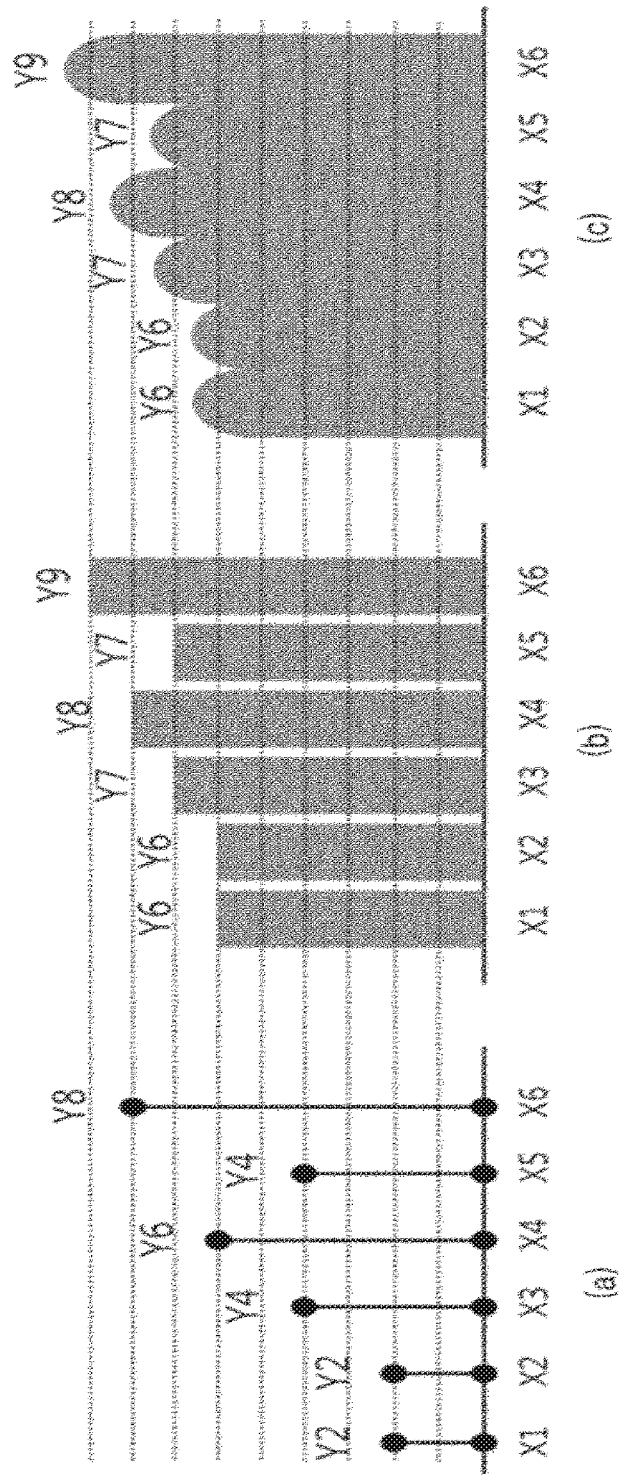
FIG. 1 illustrates a static hearing-based method of controlling audio output for each frequency according to the related art.

| | |
|---|---|
| 201: hearing diagnosis unit | 203: output level determining unit |
| 205: audio output unit | 207: volume adjustment unit |
| 500: control unit | 510: user interface |
| 520: signal tone output unit | 522: hearing threshold storage unit |
| 530: visual signal output unit | 532: output level adjustment unit |
| 601: frequency selection module | 603: volume adjustment module |
| 605: visual information output module | |

DETAILED DESCRIPTION

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In describing the drawings, like reference numerals are used for like elements.

Certain embodiments of the present invention are described below in more detail with reference to the accompanying drawings.

The present invention relates to a method and apparatus for outputting audio signals and a method of adjusting volume that enable the output of optimal audio signals that are in accordance with frequency-specific hearing thresholds of the user of an audio device. If the user's hearing is improved while listening to the audio signals, the volume specific to each frequency band can be adjusted to agree with the improved hearing ability for each frequency.

More specifically, an aspect of the present invention proposes a method of providing distinguishing visual clues together with the audio signals for the respective frequency bands, in order that the user may easily perceive the particular frequency bands for which volume adjustment is needed. Based on the visual clues, the user can personally adjust the output signal level for the corresponding frequency band.

Figure 2:
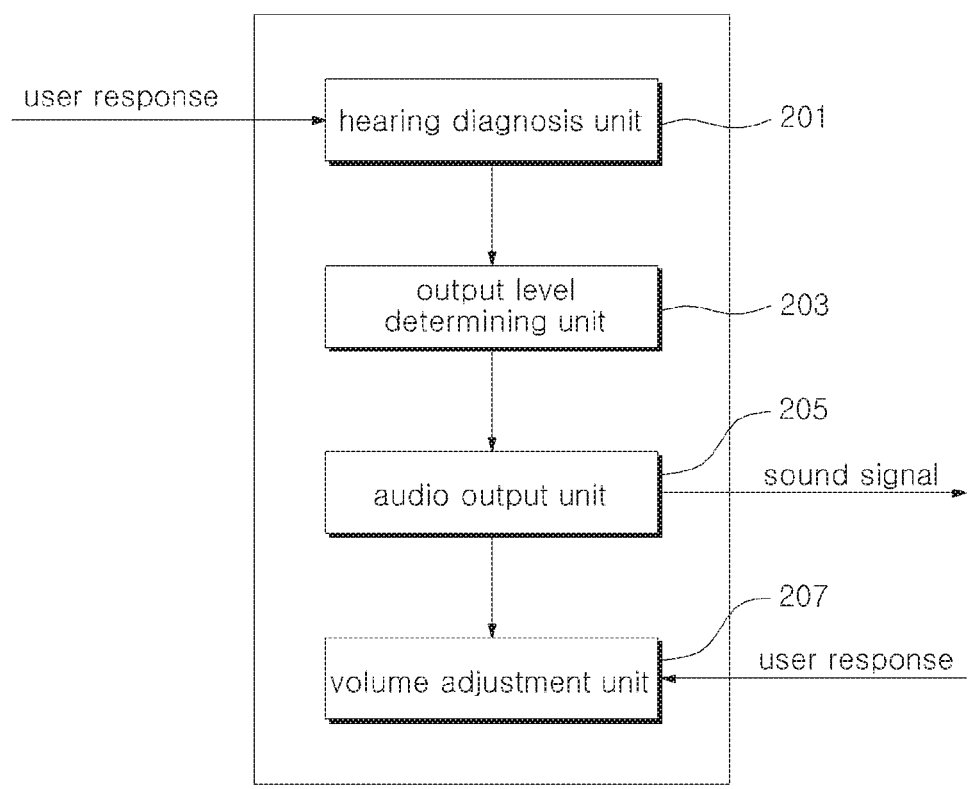
FIG. 2 is a block diagram of an apparatus for outputting audio signals according to an embodiment of the present invention.

FIG. 2 is a block diagram of an apparatus for outputting audio signals according to an embodiment of the present invention.

As illustrated in FIG. 2, an apparatus for outputting audio signals according to an embodiment of the invention can include a hearing diagnosis unit 201, an output level determining unit 203, an audio output unit 205, and a volume adjustment unit 207.

The hearing diagnosis unit 201 may provide the user with a signal tone corresponding to a particular frequency band, and may measure the threshold of hearing at each frequency band by using the user's response information provided in response to the signal tone.

Here, the threshold of hearing refers to the lowest sound level that can be heard by the person being tested. The measuring of hearing ability can be performed by PTA (pure tone audiometry), OAE (otoacoustic emission), ERA (evoked response audiometry), etc.

A threshold of hearing measured by pure tone audiometry according to the international standard reflects only the hearing test result for a point in one frequency. Thus, in an embodiment of the present invention, the signal tone used for the measurement of a hearing threshold for a particular frequency band can be a frequency modulated tone or a band noise, which can stimulate all relevant frequency bands, instead of a pure tone.

Here, a frequency modulated tone can be in the form of a sweep tone that oscillates periodically or non-periodically across sections of certain frequency bands to apply a continuous stimulus.

Also, a band noise can be narrowband noise, so as to apply stimuli over the relevant frequency bands concurrently, in the form of pulsative amplitude-modulated narrowband noise, rather than continuous band noise, which can be difficult to perceive audibly at the hearing threshold levels.

The output level determining unit 203 may determine the output levels of the modulated signals that are to be outputted, by using the hearing threshold measured for each frequency band at the hearing diagnosis unit 201. The output level of a modulated signal determined here can be determined in correspondence to the output level of the hearing threshold, and according to an embodiment of the present invention, a modulated signal can be outputted at a level that is the same as the level of the hearing threshold or is lower by a preset value.

Also, the output level of the modulated signal may be used to determine the output level of the audio signal that will be outputted for each frequency band.

The output level of the audio signal may be determined by adding a preset value to the level of the heating threshold. However, outputting the audio signal at a certain level or higher can adversely affect the user's hearing.

As such, the output level determining unit 203 can determine the output level of the audio signal by using a weight value with the level of the threshold of hearing. Here, the determining of the output level of an audio signal using a weight can employ Equation 1 shown below.

$$Y=Tw+R \quad \text{[Equation 1]}$$

Here, Y is the output level of the audio signal, T is the level of the hearing threshold, w is a weight having a value from 0 to 1, and R is a preset constant.

Figure 3:
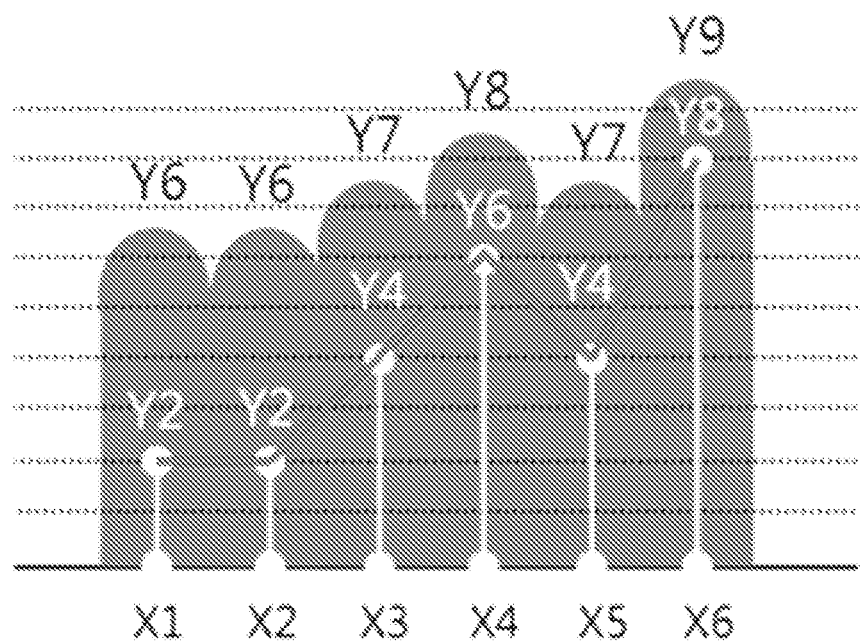
FIG. 3 illustrates an example of audio signal output levels determined by using weights according to an embodiment of the present invention.

FIG. 3 illustrates an example of audio signal output levels determined by using weights according to an embodiment of the present invention. In FIG. 3, the X axis represents frequency, and the Y axis represents output level.

Referring to FIG. 3, for the frequency band X1, the threshold of hearing is Y2, and the output level of the audio signal is Y6. Also, for the frequency band X6, the threshold of hearing is Y8, and the output level of the audio signal is Y9.

That is, when using Equation 1, an increase in the level of the hearing threshold leads to a decrease in the rate of increase of the output level of the audio signal.

The audio output unit 205 may simultaneously output the audio signal, of which the output level was determined according to each frequency band, and the modulated signal, of which the output level corresponds to the level of the hearing threshold.

Figure 4:
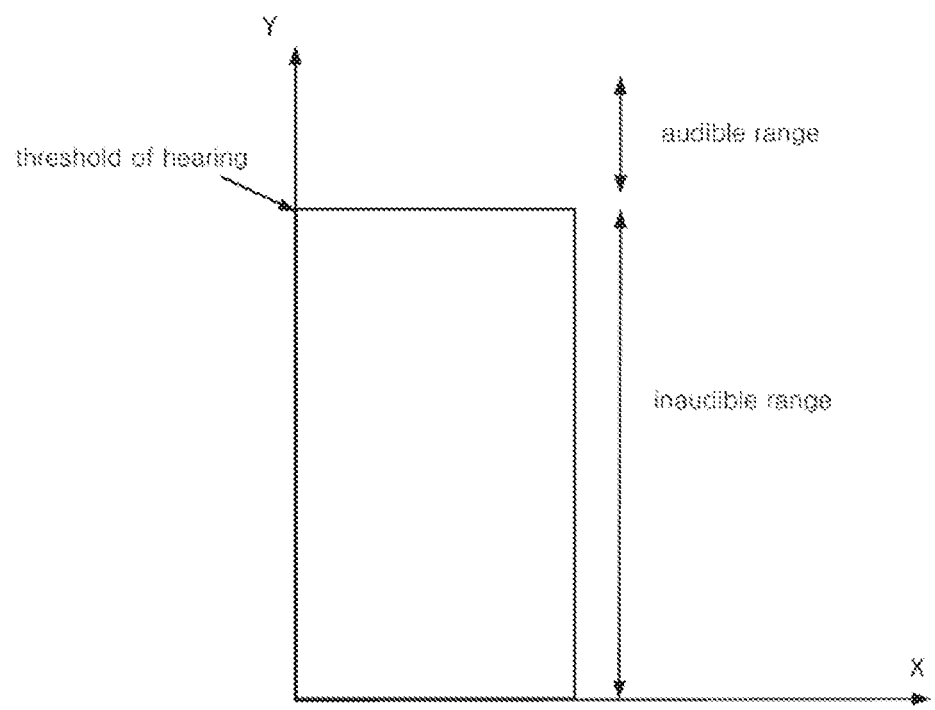
FIG. 4 illustrates an example of a threshold of hearing according to an embodiment of the present invention.

FIG. 4 illustrates an example of a threshold of hearing according to an embodiment of the present invention.

Referring to FIG. 4, a user can perceive output signals that are outputted at levels higher than or equal to the level of the hearing threshold.

Therefore, when a modulated signal, of which the level is equal to the level of the hearing threshold or is lower than the hearing threshold by a preset amount, is outputted together with an audio signal from the audio output unit 205, the modulated signal would not be perceived or would be perceived as a very small sound when the user is listening to the audio signal.

The audio output unit 205 may output the modulated signal having an output level corresponding to the level of the hearing threshold for each frequency band, and as such, the user may be exposed to a sound conditioning environment when listening to the audio signals. In this way, the hearing ability can be improved according to frequency bands.

When the user's hearing ability is improved for a particular frequency band, the volume adjustment unit 207 may adjust the volume for the corresponding frequency band by using the user's response signal.

To be more specific, the volume adjustment unit 207 can output visual signals that are synchronized with the modulation patterns of the modulated signals for the respective frequency bands.

Here, a modulation pattern can refer to the modulation pattern of the frequency or the amplitude of the modulated signal.

According to an embodiment of the present invention, the modulated signals outputted for the respective frequency bands can have different modulation patterns. Thus, a user can compare a particular modulated signal, which can now be heard due to an improvement in hearing, with the visual signals provided for the respective frequency bands, and can thus perceive the frequency band for which the user's hearing has improved. A more detailed description will be provided later on with reference to the drawings.

Next, after the user perceives the frequency band for which the user's hearing has improved, the user may manipulate the volume adjustment module to make adjustments for the corresponding frequency band until the modulated signal for the frequency band can no longer be heard, and the volume adjustment unit 207 may receive the user's response information regarding the volume adjustment and adjust the level of the modulated signal for the corresponding frequency band.

In this way, the user can select the frequency band for the modulated signal that is perceived due to improved hearing and adjust the volume, thereby establishing a sound conditioning environment for dynamic hearing.

A more detailed description of an apparatus for outputting audio signals according to an embodiment of the invention is provided below with reference to FIG. 5.

Figure 5:
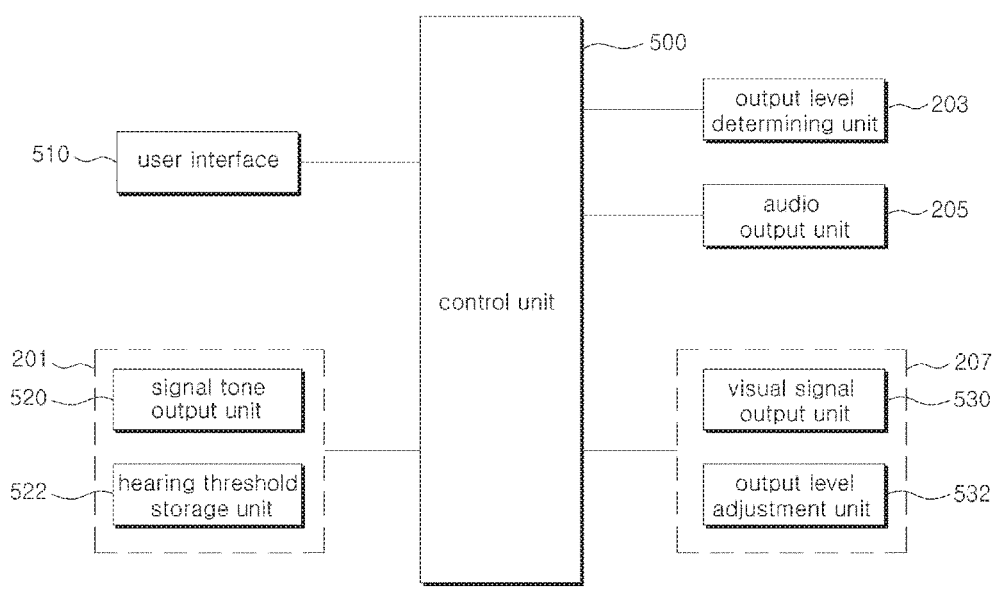
FIG. 5 is a block diagram illustrating the detailed composition of an apparatus for outputting audio signals according to an embodiment of the present invention.

FIG. 5 is a block diagram illustrating the detailed composition of an apparatus for outputting audio signals according to an embodiment of the present invention.

The control unit 500 may generally control the overall operations of the components of the apparatus for outputting audio signals.

Figure 6:
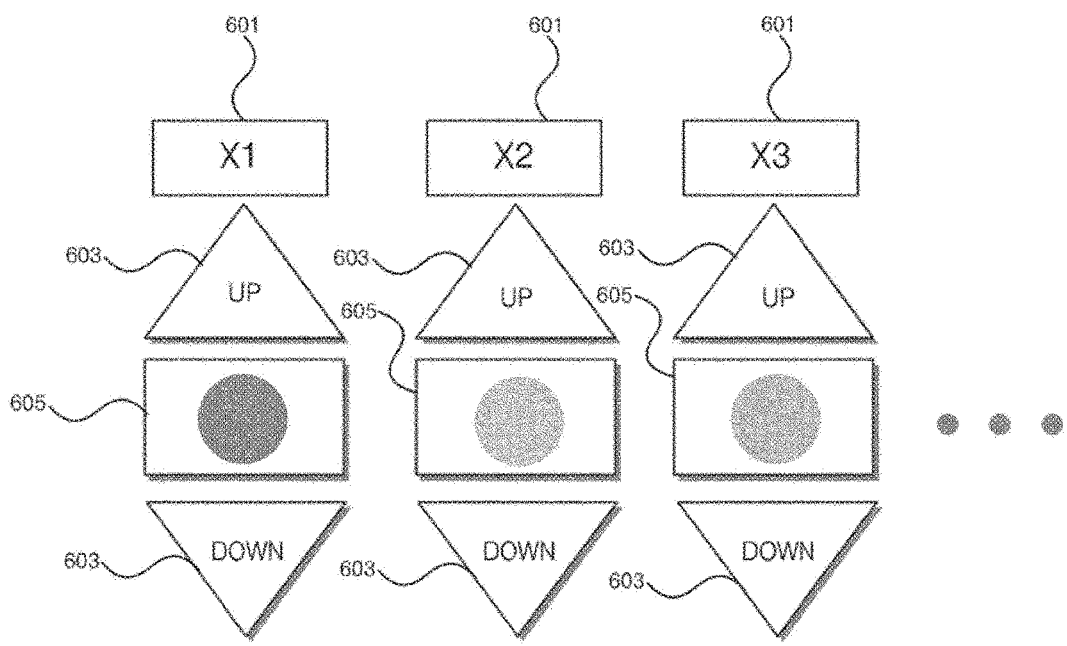
FIG. 6 illustrates an example of a user interface according to an embodiment of the present invention.

The user interface 510 may provide an interface, such as that illustrated in FIG. 6, by which the user, i.e. a person being tested and not an expert skilled in measuring hearing ability, can personally diagnose the user's hearing ability and make volume adjustments according to an improvement in hearing.

As illustrated in FIG. 6, an interface according to an embodiment of the present invention can include a frequency selection module 601 for selecting a frequency band, a volume adjustment module 603, and a visual information output module 605.

The frequency selection module 601, volume adjustment module 603, and visual information output module 605 can be provided differently according to frequency band. Although the descriptions above refer to the interface being provided in a hardware form, it would be obvious to those of ordinary skill in the art that the components included in the interface can be outputted on a display unit (not shown) that allows the user to input controls by way of key buttons, a mouse, or a touch screen, etc.

As illustrated in FIG. 5, a hearing diagnosis unit 201 according to an embodiment of the present invention can include a signal tone output unit 520 and a hearing threshold storage unit 522.

If a user selects one of the multiple frequency bands by using the frequency selection module 601, the signal tone output unit 520 may output a signal tone that corresponds to the frequency band.

When the signal tone is outputted, the user can adjust the level of the signal tone by making an adjustment on the volume adjustment module 603 for the corresponding frequency band, and response information for the point at which the signal tone is not heard may be transmitted to the hearing threshold storage unit 522.

The hearing threshold storage unit 522 may receive the user's response information for the signal tone inputted through the volume adjustment module 603 and store it as the threshold of hearing for the corresponding frequency band. More specifically, the response information may include information on the output level of the signal tone at the time point when the volume adjustment is completed, and the hearing threshold storage unit 522 may store the output level of the signal as the hearing threshold.

According to an embodiment of the present invention, the signal tone can be the modulated signal being outputted together with the audio signal from the audio output unit 205.

Also, the modulated signals can have different modulation patterns for the respective frequency bands. Here, the output level determining unit 203 can determine the output level of a modulated signal by using the output level of the signal tone included in the user's response information.

The hearing thresholds for multiple frequency bands can be measured in the manner described above.

Referring to FIG. 5, the volume adjustment unit 207 can include a visual signal output unit 530 and an output level adjustment unit 532.

When the user perceives the modulated signal for a particular frequency band from among the multiple frequency bands due to an improvement in hearing, it may be difficult to ascertain which frequency band the modulated signal is associated with.

Therefore, the visual signal output unit 530 may output a visual signal for each frequency band by using the visual information output module 605, where the visual signal may change synchronized with the modulation pattern of the modulated signal.

Here, the visual information outputted through the visual information output module 605 may be outputted as a waveform graphic that is distinguishable for each modulation pattern or as a visual pattern graphic similar to Morse code.

More specifically, since the modulated signal for each frequency band may have a different modulation pattern, the visual signal for the respective frequency band synchronized with the modulation pattern may also change according to a different waveform or visual pattern.

Therefore, if, due to an improvement in the user's hearing, one or more modulated signals are perceived by the user from among the modulated signals for the respective frequency bands, then the user may perceive the visual signal that changes according to the same modulation pattern as the corresponding modulated signals from among the visual signals outputted for the frequency bands.

That is, as the user perceives a particular visual signal, the user can ascertain the frequency band corresponding to the perceived visual signal.

The user can adjust the level of the modulated signal such that the corresponding modulated signal is no longer heard, by making adjustments on the volume adjustment module 603 for the perceived frequency band, and the output level adjustment unit 532 may receive the user's response signal associated with the adjustment on the volume adjustment module and may adjust the output level of the corresponding modulated signal.

In this case, the output level determining unit 203 can redetermine the output level of the audio signal that is outputted together with the adjusted modulated signal, with the adjusted level of the modulated signal substituted as the level of the threshold of hearing.

Figure 7:
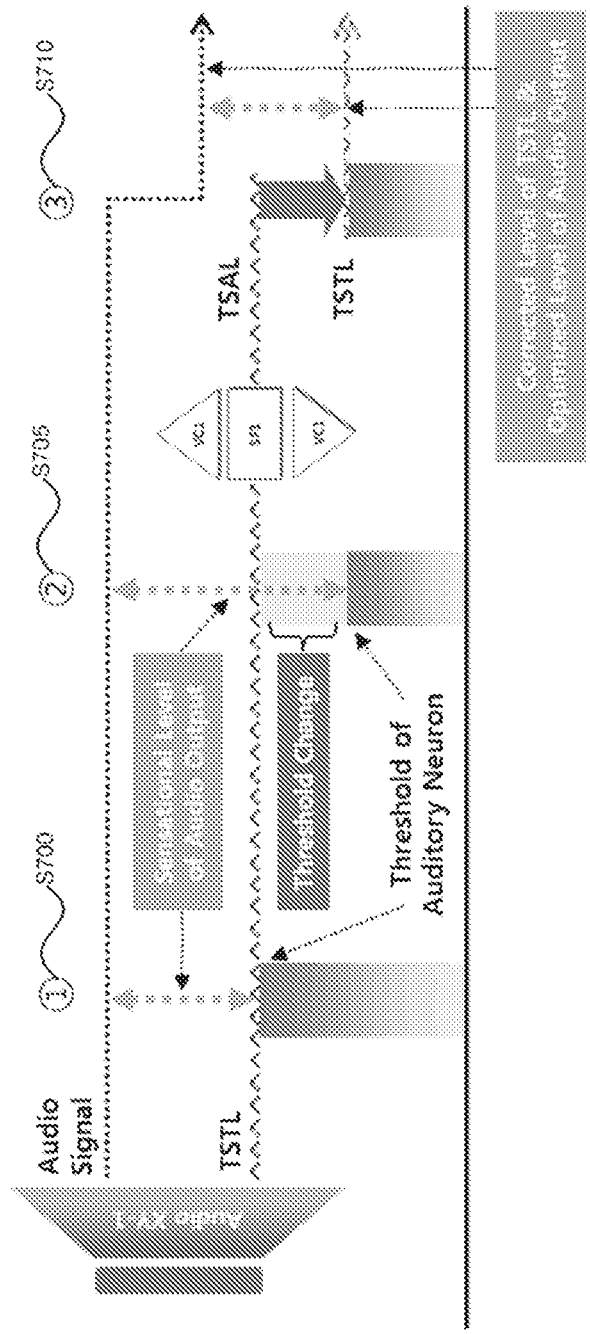
FIG. 7 illustrates an example of volume adjustment according to an embodiment of the present invention.

FIG. 7 illustrates an example of volume adjustment according to an embodiment of the present invention.

In FIG. 7, TSTL (Trigger Signal at Threshold Level) represents a modulated signal at the hearing threshold level, while TSAL (Trigger Signal at Audible Level) represents a modulated signal at an audible level.

As illustrated in FIG. 7, an audio signal and a modulated signal (TSTL) corresponding to the threshold of hearing may be outputted simultaneously in step S700.

In step S705, the modulated signal at the hearing threshold level (TSTL) may be perceived by the user as a modulated signal of an audible level (TSAL) due to an improvement in hearing.

In this case, the user may adjust the volume such that the modulated signal of an audible level (TSAL) becomes a modulated signal at the hearing threshold level (TSTL) in step S710, thereby setting the output level of the audio signal to adapt to the dynamic change in the hearing threshold.

FIG. 8 is a flowchart illustrating the overall flow of a method of outputting audio signals according to an embodiment of the present invention.

The operation performed at each step is described below with reference to FIG. 8.

First, in step S800, the threshold of hearing for each respective frequency band may be measured. For this, a signal tone corresponding to a frequency band selected by the user may be outputted, and the threshold of hearing for the respective frequency band may be measured by using the response information of the user responding to the signal tone.

In step S805, the output levels of the modulated signal and audio signal for each respective frequency band may be determined by using the threshold of hearing.

In step S810, the audio signal with the output level determined above and the modulated signal having an output level corresponding to the level of the hearing threshold may be outputted simultaneously for each frequency band.

In this case, the modulated signals can have different modulation patterns according to the respective frequency bands.

In step S815, a visual signal that changes in synchronization with the modulation pattern of the modulated signal may be outputted for each respective frequency band.

If one or more modulated signal from among the modulated signals for the respective frequency bands is perceived by the user due to an improvement in hearing, then the user can ascertain the frequency band corresponding to the perceived modulated signal by using the perceived modulated signal and its corresponding visual signal.

The user may adjust the output level of the modulated signal by using the volume adjustment module 603 corresponding to the perceived frequency band until the modulated signal is no longer heard.

In step S820, the output level of the perceived modulated signal may be adjusted by using the response signal associated with the user's volume adjustment.

Lastly, in step S825, the output level of the audio signal that is outputted together with the adjusted modulated signal may be redetermined, with the adjusted output level of the modulated signal substituted as the level of the hearing threshold.

In this case, the features of the apparatus for outputting audio signals described above with reference to FIG. 2 through FIG. 7 can be applied also to this embodiment. As such, further details are omitted here.

According to an embodiment of the present invention as described above, the user can use visual signals to personally set the output levels of audio signals that is optimal for each frequency band in accordance with changes in the user's dynamic hearing threshold for each respective frequency band, even while listening to audio signals of which the output level for each frequency band was determined previously.

Also, according to an embodiment of the present invention, the existing two-step procedure of first performing hearing tests to determine the optimal output level of audio signals for each respective frequency band and then performing fitting can be integrated into a one-step procedure. That is, an embodiment of the present invention allows the user to personally measure the hearing thresholds by diagnosing hearing ability and determine the output levels of the audio signals by using the results, without requiring a separate step of hearing tests.

The following descriptions describe an application of an embodiment of the present invention to a multi-channel hearing aid.

In the related art, if the user of a multi-channel hearing aid experiences an improvement in hearing ability for a particular frequency band through sound conditioning, then the user may have to personally lower the audio output of the corresponding frequency band in accordance with the improved level of hearing. However, with the existing technology, it may be difficult for the user of the hearing aid to perceive the particular frequency band for which there was an improvement and directly lower the volume of the frequency band.

Thus, if the user of a conventional multi-channel hearing aid experiences an improvement in hearing in a particular high-frequency band, the user would merely feel that the sound quality of the hearing aid has become sharper and would not know exactly which frequency band the volume should be lowered in. If there were an improvement in hearing in a low-frequency band, the sound quality of the hearing aid may become relatively unclear and outside noise may feel louder than before, but in this case also, it would be difficult to ascertain exactly which frequency band there was a hearing improvement in unless a pure tone audiometry test is applied, and the audio output of the corresponding frequency band would have to be lowered with the help of a hearing aid expert based on the new hearing test results defined by the audiometry test.

However, with a multi-channel hearing aid to which an apparatus for outputting audio signals according to an embodiment of the present invention has been applied, the user of the hearing aid can perceive improvements in hearing ability from the modulated signal presented in the invention. Also, from the visual signals synchronized with the modulated signals of the respective frequency bands, the user of the hearing aid can visually recognize the frequency bands for which there was an improvement in hearing. Therefore, the user can easily adjust the audio output levels of the corresponding frequency bands on his/her own, and can reestablish a sound conditioning environment in accordance with the improved level of hearing.

Also, the apparatus and method for outputting audio signals according to an embodiment of the present invention can be applied to various audio devices (MP3P, TV, radio, etc.) other than a hearing aid, and the user can easily adjust the output level of audio signals for each respective frequency band in accordance with the user's own real-time dynamic hearing ability for the respective frequency bands.

While the present invention has been described above using particular examples, including specific elements, by way of limited embodiments and drawings, it is to be appreciated that these are provided merely to aid the overall understanding of the present invention, the present invention is not to be limited to the embodiments above, and various modifications and alterations can be made from the disclosures above by a person having ordinary skill in the technical field to which the present invention pertains. Therefore, the spirit of the present invention must not be limited to the embodiments described herein, and the scope of the present invention must be regarded as encompassing not only the claims set forth below, but also their equivalents and variations.

The invention claimed is:

1. A method for outputting an audio signal, the method comprising:
measuring, by a processor, a first hearing threshold of a user in a frequency band among a plurality of predefined frequency bands;
setting, by the processor, an output level of a modulated signal in the frequency band to a level less than or equal to a level of the first hearing threshold;
setting, by the processor, an output level of an audio signal in the frequency band to a level greater than the level of the first hearing threshold, wherein the output level of the audio signal is determined using a weight value and the level of the first hearing threshold, such that an increase of the level of the first hearing threshold causes a decrease of a rate of increase of the output level of the audio signal in the frequency band;
outputting, by the processor, the modulated signal and the audio signal simultaneously via an audio output unit, wherein the modulated signal is outputted at a level that is equal to the level of the first hearing threshold;
outputting, by the processor, an interface via a display unit, the interface including:
  i) a frequency selection module for selecting one of the plurality of predefined frequency bands on a display unit,
  ii) a visual information output module for outputting a visual signal which changes in synchronization with a modulation pattern of the modulated signal for each respective frequency band of the plurality of predefined frequency bands, the visual signal being output in a different visual pattern for each frequency band according to the modulation pattern, and
  iii) a volume adjustment module for dynamically adjusting the first hearing threshold according to an improvement in hearing of the user by adjusting an intensity of a modulated signal of the selected frequency band such that the modulated signal of the selected frequency band is not audible,
  wherein the visual information output module is outputted at a position in a central area of the volume adjustment module, the visual signal outputted by the visual information output module for each frequency band changes according to the same modulation pattern as that of the corresponding modulation signal, and the visual signal is outputted at a fixed position when the volume adjustment module is adjusted;
receiving, by the processor, response information of the user via the interface responding to the visual signals for the respective frequency bands when the user perceives one or more of the modulated signals for the respective frequency bands as a result of the improvement in hearing of the user;
adjusting, by the processor, an output level of the one or more perceived modulated signals based on the response information of the user until the modulated signal is no longer heard by the user;
measuring, by the processor, a second hearing threshold of the user in the frequency band that is lower than the first hearing threshold based on response information received from the user; and
adjusting, by the processor, the respective output levels of the modulated signal and the audio signal based on the second hearing threshold,
wherein the adjusting of the respective output levels of the modulated signal and the audio signal includes lowering the output level of the modulated signal to a level less than or equal to a level of the second hearing threshold and lowering the output level of the audio signal to a level greater than the level of the second hearing threshold.

2. The method of claim 1, further comprising:
outputting, by the processor, a signal tone via the audio output unit in the event that the user selects at least one of the plurality of frequency bands, the signal tone corresponding to the selected frequency band; and
measuring, by the processor, the first hearing threshold by using response information of the user responding to the signal tone.

3. The method of claim 2, wherein the signal tone is the modulated signal, the modulated signal has a different modulation pattern for each respective frequency band, and the output level of the modulated signal is determined by using the response information of the user responding to the signal tone.

4. The method of claim 1, further comprising:
calculating, by the processor, a weight value w,
wherein the output level of the audio signal is determined by using an equation shown below:

$$Y=Tw+R,$$

wherein Y is the output level of the audio signal, T is a level of the first or second hearing threshold, and R is a preset constant.

5. The method of claim 1, wherein the modulated signal has a different modulation pattern for each respective frequency band.

6. The method of claim 5, wherein the modulated signal is composed of at least one of a frequency modulated tone and a band noise or a combination thereof.

7. An apparatus for outputting an audio signal, the apparatus comprising:
a processor configured to:
measure a first hearing threshold of a user in a frequency band among a plurality of predefined frequency bands;
set an output level of a modulated signal in the frequency band to a level less than or equal to a level of the first hearing threshold;
set an output level of an audio signal in the frequency band to a level greater than the level of the first hearing threshold, wherein the output level of the audio signal is determined using a weight value and the level of the first hearing threshold, such that an increase of the level of the first hearing threshold causes a decrease of a rate of increase of the output level of the audio signal in the frequency band;
output the modulated signal and the audio signal simultaneously via an audio output unit, wherein the modulated signal is outputted at a level that is equal to the level of the first hearing threshold;
output an interface via a display unit, the interface including:
  i) a frequency selection module for selecting one of the plurality of predefined frequency bands on a display unit,
  ii) a visual information output module for outputting a visual signal which changes in synchronization with a modulation pattern of the modulated signal for each respective frequency band of the plurality of predefined frequency bands, the visual signal being output in a different visual pattern for each frequency band according to the modulation pattern, and
  iii) a volume adjustment module for dynamically adjusting the first hearing threshold according to an improvement in hearing of the user by adjusting an intensity of a modulated signal of the selected frequency band such that the modulated signal of the selected frequency band is not audible,
wherein the visual information output module is outputted at a position in a central area of the volume adjustment module, the visual signal outputted by the visual information output module for each frequency band changes according to the same modulation pattern as that of the corresponding modulation signal, and the visual signal is outputted at a fixed position when the volume adjustment module is adjusted;
receive response information of the user via the interface responding to the visual signals for the respective frequency bands when the user perceives one or more of the modulated signals for the respective frequency bands as a result of the improvement in hearing of the user;
adjust an output level of the one or more perceived modulated signals based on the response information of the user until the modulated signal is no longer heard by the user;
measure a second hearing threshold of the user in the frequency band that is lower than the first hearing threshold based on response information received from the user; and
adjust the respective output levels of the modulated signal and the audio signal based on the second hearing threshold,
wherein the adjusting of the respective output levels of the modulated signal and the audio signal includes lowering the output level of the modulated signal to a level less than or equal to a level of the second hearing threshold and lowering the output level of the audio signal to a level greater than the level of the second hearing threshold.

* * * * *